(12) United States Patent
Schauer et al.

(10) Patent No.: US 11,578,424 B2
(45) Date of Patent: Feb. 14, 2023

(54) EPITAXIALLY COATED SEMICONDUCTOR WAFER OF MONOCRYSTALLINE SILICON AND METHOD FOR PRODUCTION THEREOF

(71) Applicant: SILTRONIC AG, Munich (DE)

(72) Inventors: Reinhard Schauer, Laufen (DE); Joerg Haberecht, Freiberg (DE)

(73) Assignee: SILTRONIC AG, Munich (DE)

( * ) Notice: Subject to any disclaimer, the term of this patent is extended or adjusted under 35 U.S.C. 154(b) by 421 days.

(21) Appl. No.: 16/634,178

(22) PCT Filed: Jul. 12, 2018

(86) PCT No.: PCT/EP2018/068888
§ 371 (c)(1),
(2) Date: Jan. 27, 2020

(87) PCT Pub. No.: WO2019/020387
PCT Pub. Date: Jan. 31, 2019

(65) Prior Publication Data
US 2021/0087705 A1  Mar. 25, 2021

(30) Foreign Application Priority Data
Jul. 26, 2017  (DE) .......................... 102017212799.6

(51) Int. Cl.
*C30B 25/20* (2006.01)
*H01L 21/02* (2006.01)
(Continued)

(52) U.S. Cl.
CPC .............. *C30B 25/20* (2013.01); *C23C 16/24* (2013.01); *C23C 16/481* (2013.01);
(Continued)

(58) Field of Classification Search
CPC ... C30B 25/20; C23C 16/24; H01L 21/02381; H01L 21/02532; H01L 21/0262; H01L 29/16; H01L 27/14632
(Continued)

(56) References Cited

U.S. PATENT DOCUMENTS

2002/0030047 A1  3/2002  Shao et al.
2004/0067052 A1  4/2004  Goodman et al.
(Continued)

FOREIGN PATENT DOCUMENTS

JP      6441212 A      2/1989
JP   H03116828 A      5/1991
(Continued)

OTHER PUBLICATIONS

Li Mingda et al., "Uniformity adjust and control of large-area Si epitaxial layer based on planar epitaxial furnace," Electronic Components and Materials, vol. 36, No. 3, Mar. 2017, 4 pages, English Abstract included.
(Continued)

*Primary Examiner* — Thinh T Nguyen
(74) *Attorney, Agent, or Firm* — Brooks Kushman P.C.

(57) ABSTRACT

A semiconductor wafer comprises a substrate wafer of monocrystalline silicon and a dopant-containing epitaxial layer of monocrystalline silicon atop the substrate wafer, wherein a non-uniformity of the thickness of the epitaxial layer is not more than 0.5% and a non-uniformity of the specific electrical resistance of the epitaxial layer is not more than 2%.

3 Claims, 9 Drawing Sheets

(51) Int. Cl.
*H01L 27/146* (2006.01)
*C23C 16/24* (2006.01)
*C23C 16/48* (2006.01)
*C30B 25/10* (2006.01)
*C30B 29/06* (2006.01)
*C30B 29/68* (2006.01)
*H01L 29/16* (2006.01)

(52) U.S. Cl.
CPC ............ *C30B 25/105* (2013.01); *C30B 29/06* (2013.01); *C30B 29/68* (2013.01); *H01L 21/0262* (2013.01); *H01L 21/02381* (2013.01); *H01L 21/02532* (2013.01); *H01L 21/02634* (2013.01); *H01L 29/16* (2013.01); *H01L 27/14632* (2013.01); *H01L 27/14687* (2013.01)

(58) Field of Classification Search
USPC .......................................................... 428/64
See application file for complete search history.

(56) References Cited

U.S. PATENT DOCUMENTS

| | | |
|---|---|---|
| 2009/0277376 A1 | 11/2009 | Schauer et al. |
| 2010/0062611 A1 | 3/2010 | Liu et al. |
| 2010/0213168 A1 | 8/2010 | Haberecht |
| 2010/0317177 A1* | 12/2010 | Huang et al. ..... H01L 21/02381 438/478 |
| 2011/0073041 A1 | 3/2011 | Schauer et al. |
| 2011/0114017 A1 | 5/2011 | Kimura et al. |
| 2012/0007978 A1 | 1/2012 | Passek et al. |

FOREIGN PATENT DOCUMENTS

| | | |
|---|---|---|
| JP | 2000091237 A2 | 3/2000 |
| JP | 2009272633 A | 11/2009 |
| JP | 2012146997 A2 | 8/2012 |
| KR | 1020080046559 | 5/2008 |

OTHER PUBLICATIONS

Matthias Kuenle et al., "Multiple Epitaxial Si Film Deposition by APCVD for Power Semiconductors," 2015 26th Annual Semi Advanced Semiconductor Manufacturing Conference (ASMC), IEEE, 3. May 3, 2015, pp. 455-459.

Integrated Circuit Engineering Corporation: "7. Changing Wafer Size and the Move to 300 mm" in Cost Effective IC Manufacturing 1998-1999, 1997, Integrated Circuit Engineering Corporation, XP055508524.

V-M. Airaksinen et al., "Chapter 7 Epitaxial Layer Characterization and Metrology," Semiconductors and Semimetals, vol. 72, 2001, Academic Press, pp. 225-276, Chapter 11.

International Search Report, PCT/EP2018/068888, dated Oct. 8, 2018, 6 pages.

JPS 6441212 A, Espacenet English Abstract.

KR 1020080046559, US 20110073041 A1.

* cited by examiner

EPITAXIALLY COATED SEMICONDUCTOR WAFER OF MONOCRYSTALLINE SILICON AND METHOD FOR PRODUCTION THEREOF

CROSS REFERENCE TO RELATED APPLICATIONS

This application is the U.S. National Phase of PCT Appln. No. PCT/EP2018/068888 filed Jul. 12, 2018, which claims priority to German Application No. 10 2017 212 799.6 filed Jul. 26, 2017, the disclosures of which are incorporated in their entirety by reference herein.

BACKGROUND OF THE INVENTION

1. Field of the Invention

The invention provides an epitaxially coated semiconductor wafer of monocrystalline silicon having a diameter of not less than 300 mm. The invention further relates to a method of producing an epitaxially coated semiconductor wafer of monocrystalline silicon having a diameter of not less than 300 mm.

2. Description of the Related Art

Epitaxially coated semiconductor wafers of monocrystalline silicon are required as precursors for production of electronic components. Owing to superior electrical properties, they are frequently preferred over polished semiconductor wafers of monocrystalline silicon. This is the case, for example, where the production of what are called CMOS image sensors, or CIS components for short, is concerned.

Epitaxially coated semiconductor wafers of monocrystalline silicon are typically produced by gas phase deposition (CVD) of the epitaxial layer on a substrate wafer at temperatures of 1100° C. to 1250° C. Substrate wafers of monocrystalline silicon having a diameter of not less than 300 mm are typically coated in an apparatus for coating individual wafers.

US 2010/0062611 A1 describes a process for thinning the backside of a semiconductor wafer which can be used in the course of the production of backside-illuminated image sensors.

In order to be useful as a precursor for production of CIS components, the epitaxially coated semiconductor wafer has to meet particular demands. The demands are particularly demanding with regard to the thickness and specific electrical resistance (resistivity) of the epitaxial layer. Both the thickness and the specific electrical resistance, called "resistance" hereinafter, must be substantially uniform over the radius of the semiconductor wafer. A measure for description of the non-uniformity is the quotient of the difference of greatest and smallest thickness (greatest and smallest resistance) and the sum total of greatest and smallest thickness (greatest and smallest resistance) multiplied by the factor of 100%.

US 2010/0213168 A1 describes various measures for improving the uniformity of the thickness of an epitaxial layer of monocrystalline silicon.

US 2011/0114017 A1 describes a method of producing an epitaxially coated semiconductor wafer of monocrystalline silicon, wherein an epitaxial layer is deposited, and the non-uniformity of the resistance is 4% or less.

Regardless of such teachings, there is still a need for an improvement in the uniformity of layer thickness and resistance, especially because there is a lack of any satisfactory solution to date for matching the layer thickness and the resistance in a problematic edge region having a distance of up to 15 mm from the edge of the semiconductor wafer to the layer thickness and resistance of regions at greater distance from the edge. In the problematic edge region, there is a decrease in the temperature of the substrate wafer toward the edge because the substrate wafer loses heat as a result of thermal radiation close to the edge. Unless countermeasures are taken, the layer thickness of an epitaxial layer doped with a p-type dopant in this region will become less and the resistance will become greater. If the dopant is of the n-type, the resistance will become less. Known countermeasures, such as the attempt to influence the temperature field, have to date been at the expense of the uniformity of the thickness of the epitaxial layer in regions outside the problematic edge region and/or increase the propensity of the semiconductor wafer to be subject to slips. Slips arise especially on relaxation of stresses caused by temperature differences. Such temperature differences occur particularly in the edge region as radial and axial temperature gradients, i.e. as a temperature drop directed toward the edge of the substrate wafer and as a temperature difference between the substrate wafer which is colder in that case and the susceptor which is warmer in that case.

Stresses in the crystal lattice can be measured by means of SIRD (scanning infrared depolarization). US 2012/0007978 A1 contains a description of how SIRD stresses can be measured and expressed in depolarization units DU, and also a reference to a suitable measuring instrument.

SUMMARY OF THE INVENTION

The object of the present invention is that of further reducing the non-uniformity of the thickness of the epitaxial layer and the non-uniformity of the resistance of the epitaxial layer without increasing the propensity of the semiconductor wafer to development of slips. These and other objects are achieved by a semiconductor wafer of monocrystalline silicon having a diameter of not less than 300 mm, comprising a substrate wafer of monocrystalline silicon and a dopant-containing epitaxial layer of monocrystalline silicon atop the substrate wafer, wherein a non-uniformity of the thickness of the epitaxial layer is not more than 0.5% and a non-uniformity of the specific electrical resistance of the epitaxial layer is not more than 2%.

The objects are additionally achieved by a method of producing a coated semiconductor wafer of monocrystalline silicon, comprising providing a substrate wafer of monocrystalline silicon having a diameter of not less than 300 mm;

placing the substrate wafer atop a susceptor of an apparatus for coating individual wafers, wherein the apparatus has an upper cover with an annular region which concentrates radiation transmitted through the annular region in an edge region of the substrate wafer;

heating the substrate wafer to a deposition temperature by means of a radiation source arranged above the upper cover of the apparatus;

depositing an epitaxial layer of silicon by passing method gas over the heated substrate wafer, where the method gas comprises hydrogen, inert gas and a deposition gas, and the deposition gas comprises dopant and a silicon source.

BRIEF DESCRIPTION OF THE DRAWINGS

FIG. 4 shows a schematic of the mode of action of an upper cover having an annular region that concentrates radiation passing through.

DETAILED DESCRIPTION OF THE PREFERRED EMBODIMENTS

The thickness and resistance of the epitaxial layer of the semiconductor wafer are accordingly particularly uniform. The thickness of the epitaxial layer is preferably 1 to 20 μm. The substrate wafer preferably also contains a dopant and may further additionally have been doped with carbon or with nitrogen. The semiconductor wafer is preferably a pp$^+$ wafer or an nn$^-$ wafer.

The semiconductor wafer, in an edge region with a distance of up to 15 mm from the edge of the semiconductor wafer, with an edge exclusion of 0.5 mm, has SIRD stresses which cause a degree of depolarization of preferably not more than 30 depolarization units.

The method includes measures which affect the depositing of the epitaxial layer in the problematic edge region such that the influence remains largely locally limited. For instance, it is ensured that the resistance rises and the temperature field is adjusted in this region, while simultaneously avoiding temperature gradients which cause slips.

In order to positively influence the deposition outcome, especially with regard to the resistance, the process gas comprises not only hydrogen but also inert gas. A useful inert gas is argon in particular. Alternatively, it is possible to use another noble gas or any mixture of two or more noble gases as inert gas. Preference is given to passing hydrogen and inert gas in a volume ratio of not less than 6 and not more than 20 over the substrate wafer. The additional use of inert gas surprisingly brings about an increase in the resistance in the problematic edge region and a certain improvement with regard to homogenization of the thickness of the epitaxial layer. Furthermore, the thickness of the epitaxial layer in the problematic edge region of the substrate wafer is improved in a controlled manner by coating the substrate wafer in an apparatus for coating individual wafers, the upper cover of which is structured in a particular manner. It has an annular region which, by contrast with adjacent regions, concentrates radiation passing through. The cross section through the annular region of the upper cover preferably has upward convex curvature or has the outline of a Fresnel lens. The concentrated radiation is incident in the problematic edge region of the substrate wafer, as a result of which the temperature there is selectively increased. The local increase in temperature in the problematic edge region of the substrate wafer compensates for the loss of heat that arises there as a result of thermal radiation, and its effect is that temperature differences become smaller toward regions further inward. Ultimately, in this way, the thickness of the epitaxial layer in the edge region of the substrate wafer is matched to the thickness of the epitaxial layer in regions of the substrate wafer further inward.

The invention is elucidated further hereinafter with reference to drawings.

Figure 1A:
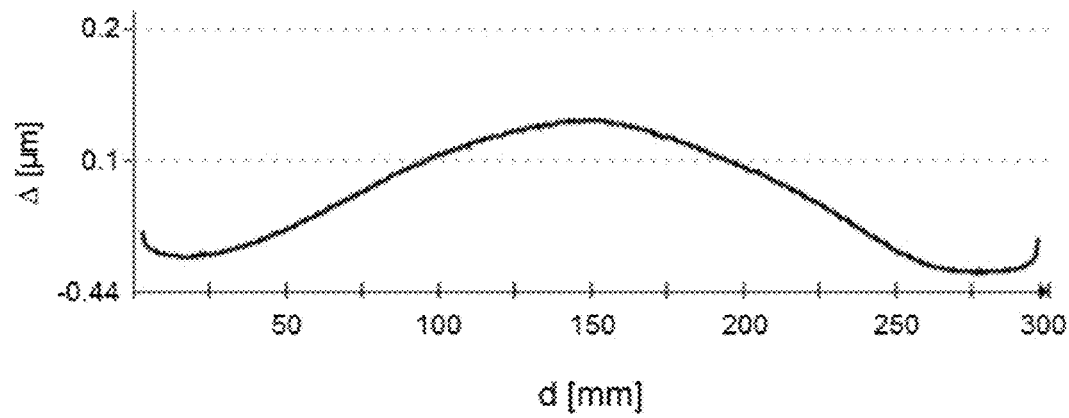
FIG. 1$a$ and FIG. 1$b$ show the effect of argon in the process gas on the homogenization of the thickness of the epitaxial layer.
Figure 1B:
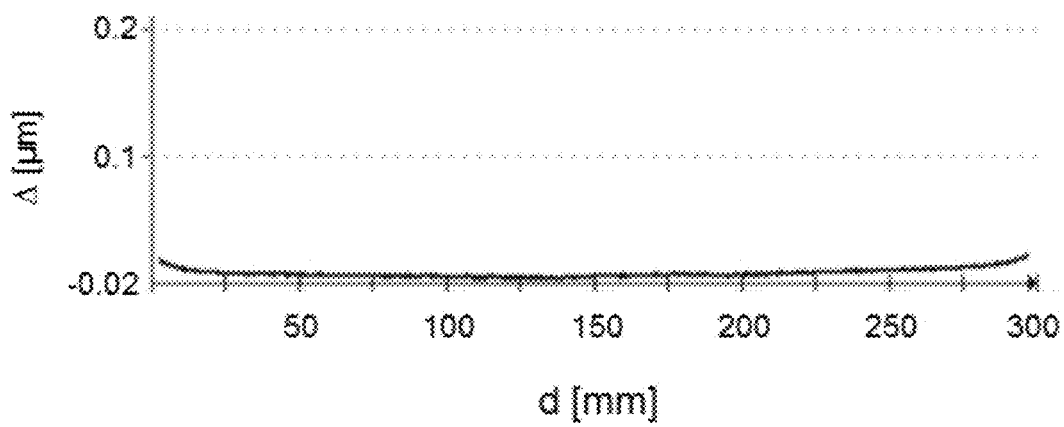

LIST OF REFERENCE NUMERALS USED 1 upper cover
2 lower cover
3 side wall
4 substrate wafer
5 susceptor
6 radiation source
7 annular region of the upper cover
8 radiation passing through
9 epitaxial layer
10 material FIG. 1a and FIG. 1b show the effect of argon in the process gas on the homogenization of the thickness of the epitaxial layer. What is shown in each case is a typical profile of deviation of the thickness of the epitaxial layer from a target thickness 4 versus the diameter d of the substrate wafer. The profile of the thickness of the epitaxial layer in the case of FIG. 1b is more uniform than in the case of FIG. 1a. This difference is attributable to the fact that the process gas in the deposition of the epitaxial layer additionally contained argon (FIG. 1b), or did not contain any argon (FIG. 1a). Argon was fed in with a proportion of 3 slm. The proportion of hydrogen in both cases was 50 slm. The deposition gas was the same in both cases, as was the deposition temperature, namely 1115° C.

Figure 2:
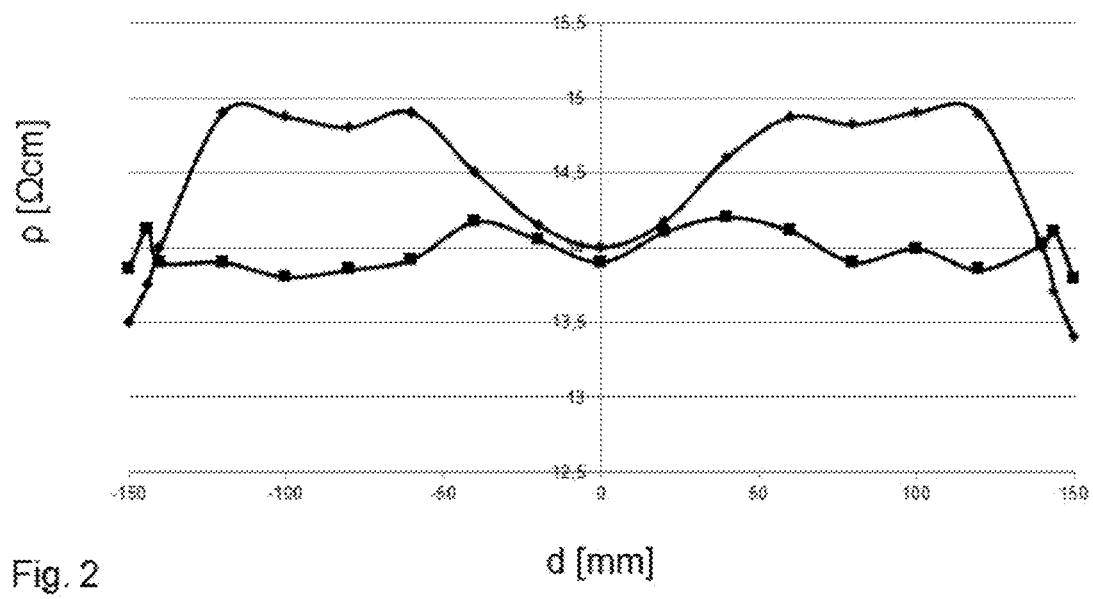
FIG. 2 shows the effect of argon in the process gas on the homogenization of the resistance of the epitaxial layer.

FIG. 2 shows the effect of argon in the process gas on the homogenization of the resistance of the epitaxial layer. Two curves are shown, which show the profile of the resistance p versus the diameter d of the semiconductor wafer. The more uniform resistance profile (curve with square data points) is attributable to the fact that the process gas in the deposition of the epitaxial layer additionally contained argon and did not in the comparative case (curve with diamond-shaped data points). Argon was supplied with a proportion of 3 slm. The proportion of hydrogen in both cases was 60 slm.

Figure 3:
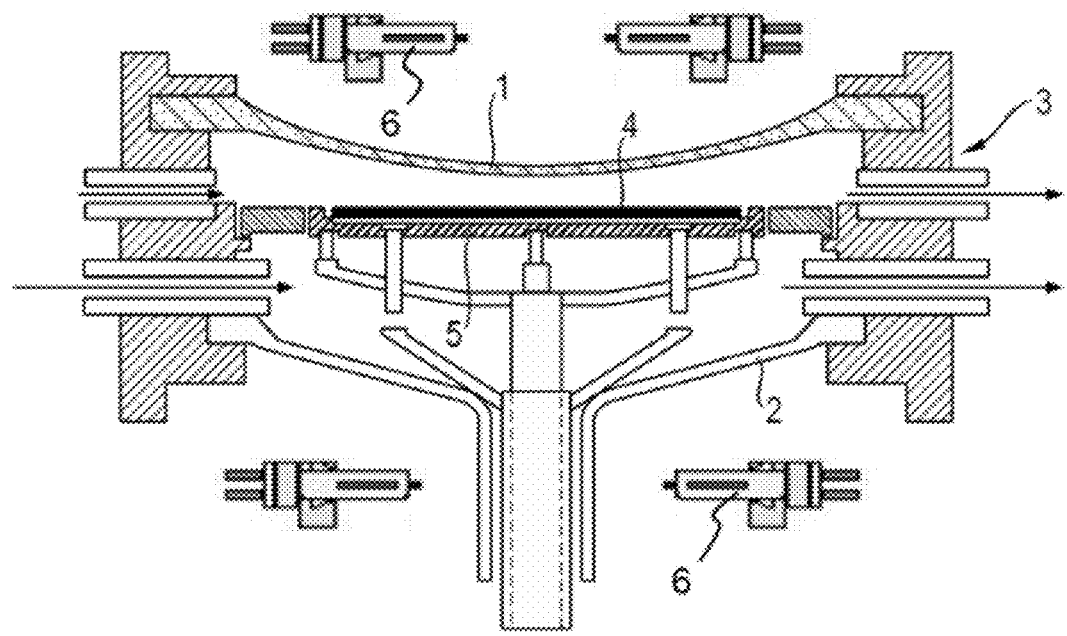
FIG. 3 shows the cross section of an apparatus suitable for coating individual wafers by means of CVD.

The apparatus shown in FIG. 3 comprises a reactor chamber bounded by an upper cover ("upper dome") 1, a lower cover ("lower dome") 2 and a side wall 3. The upper and lower covers 1, 2 are transparent to thermal radiation which is emitted by the radiation sources 6 arranged above and below the reactor chamber. The epitaxial layer is deposited from the gas phase on the top side of the substrate wafer 4, by passing process gas over the substrate wafer heated by thermal radiation. The process gas is fed in through a gas inlet in the side wall 3, and the offgas remaining after the reaction is removed through a gas outlet in the side wall 3. The apparatus shown represents an embodiment having a further gas inlet and a further gas outlet in order, for example, to be able to introduce a purge gas into the volume of the reactor chamber beneath the substrate wafer and discharge it therefrom. However, the further gas inlet and the further gas outlet make no contribution to the achievement of the object of the invention. During the deposition of the epitaxial layer, the substrate wafer 4 lies on the contact area of a susceptor 5 and is rotated about an axis of rotation in the middle of the substrate wafer together with the susceptor.

Figure 4:
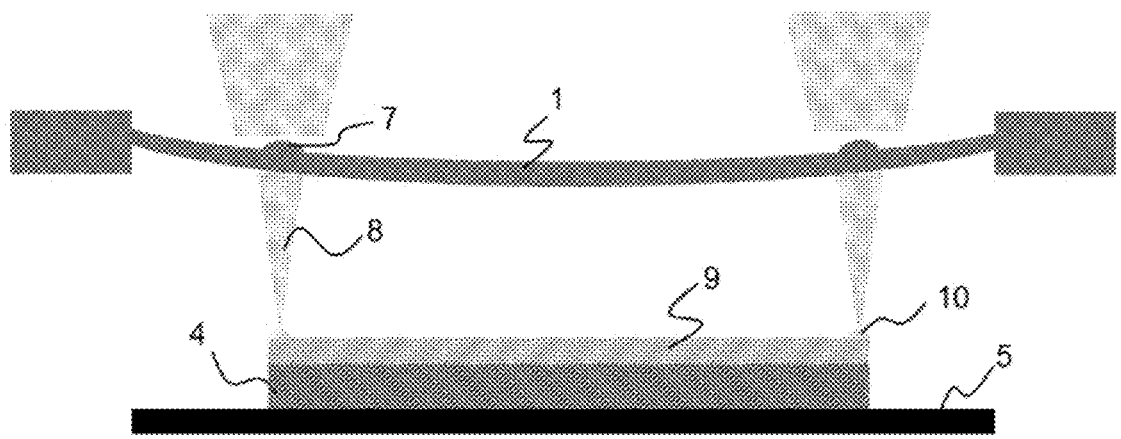

The upper lid 1 has an annular region 7 (FIG. 4) which concentrates radiation passing through. The thickness of the upper lid 1 is greater in the annular region 7 than in the adjoining regions. The cross section through the annular region of the upper cover preferably has upward convex curvature or has the outline of a Fresnel lens. The annular region 7 acts on the radiation 8 passing through like a collecting lens that concentrates radiation. The concentrated radiation is incident in the edge region of the substrate wafer, which preferably has a distance of up to 15 mm from the edge of substrate wafer 4. The incident radiation eliminates a radial temperature drop in the edge region, such that an envisaged amount of material 10 is deposited there and the thickness of the epitaxial layer 9 attains an envisaged value.

Figure 5:
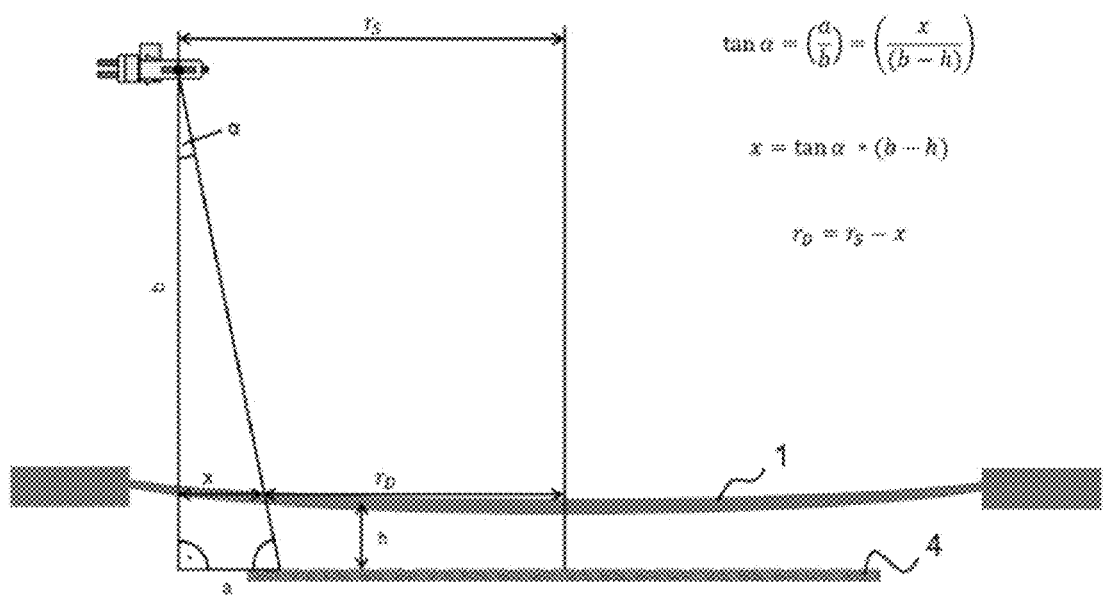
FIG. 5 shows the geometric relationship between the position of the annular region of the upper cover and the edge region of the substrate wafer in which radiation is concentrated when it passes through the annular region of the cover.

The position of the annular region 7 of the upper cover and that of the edge region of the substrate wafer correlate according to the rules of beam optics, as shown in FIG. 5. The length $r_D$ denotes the distance of the annular region 7 of the upper cover 1 from the perpendicular through the middle of the upper cover and is calculated from the difference between the lengths $r_S$ and x. The length $r_D$ can be calculated as an approximation with defined heights b and h, defined length a and defined angle α, where the height b denotes the distance of the radiation source from the plane of the substrate wafer, the length $r_S$ denotes the distance of the radiation source from the perpendicular through the middle of the upper cover, the height h denotes the distance of the upper cover 1 from the substrate wafer 4, the length x denotes the distance of the annular region 7 from the height b, the length a denotes the greatest distance of the edge region of the substrate wafer from the height b, and the angle α denotes the angle, opposite the base, of a triangle with height b and length a as the base.

Semiconductor wafers of monocrystalline silicon were produced by the method of the invention and, for the purpose of comparison, semiconductor wafers were also produced by a different method.

Substrate wafers of monocrystalline silicon having a diameter of 300 mm were coated in a single-wafer apparatus according to FIG. 3 within an epitaxial layer of silicon, after they had been divided from a single crystal, ground, etched and polished.

On employment of the method of the invention, the apparatus had an upper cover having an annular region that concentrated the radiation that passed through in an edge region of the substrate wafer. On employment of the different method, the upper cover lacks this structure.

On employment of the method of the invention, the process gas consisted of hydrogen (70 slm), argon (5 slm) and deposition gas (trichlorosilane (6 slm), diborane (50 ppm in hydrogen (180 sccm)) diluted in 4 l of hydrogen), and the epitaxial layer was deposited at a temperature of 1130° C.

On employment of the different method, the process gas consisted solely of hydrogen (55 slm) and deposition gas (trichlorosilane (10 slm), diborane (50 ppm in hydrogen (180 sccm)) diluted in 4 l of hydrogen), and the epitaxial layer was deposited at a temperature of 1125° C.

Figure 6:
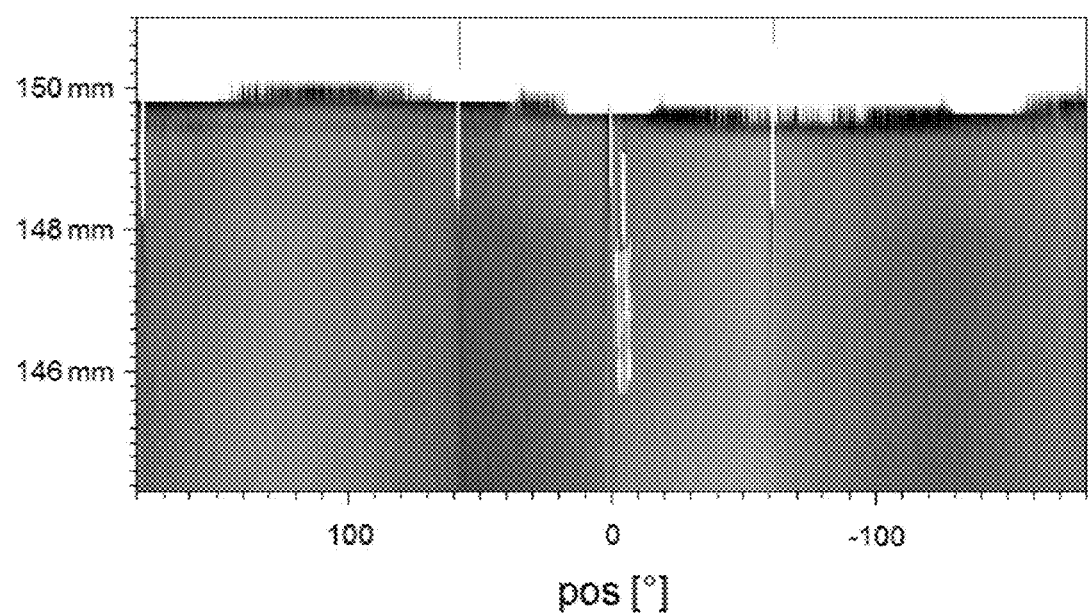
FIG. 6 and FIG. 7 show images of SIRD measurements on a semiconductor wafer produced in accordance with the invention (FIG. 6) and on a semiconductor wafer (FIG. 7) which not has been produced in an inventive manner.
Figure 7:
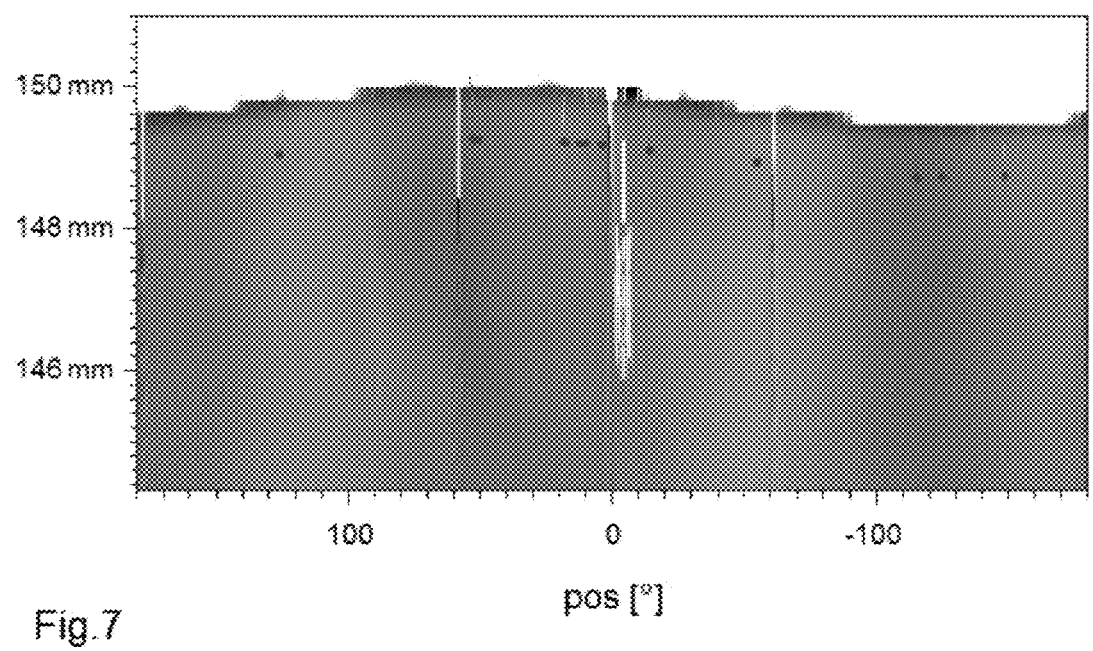

FIG. 6 shows the image of an SIRD measurement on a semiconductor wafer produced in accordance with the invention. The degree of depolarization remained within the preferred degree. In none of the measurement cells was the degree of depolarization greater than 30 DU. In the case of the semiconductor wafer that was produced by the different method, 0.907% of the measurement cells were noticeable owing to a degree of depolarization of more than 30 DU (FIG. 7). The SIRD measurement was conducted with an SIRD-AB300 instrument from PVA TePla AG, placing a polar coordinate grid with a cell size of 1 mm (radius) and 2 mm (azimuth) over the measurement area for evaluation. For each cell of the grid, the degree of depolarization was determined. A depolarization unit DU corresponds to a degree of depolarization of $1\times10^{-6}$. What is shown in each case is the unrolled peripheral region of the semiconductor wafer with a distance of 4.5 mm or less from the edge of the semiconductor wafer and with the notch position (pos=0°) in the middle. The peripheral region with a distance of 15 mm to 4.5 mm from the edge of the semiconductor wafer is not shown because the SIRD stress was unremarkable in both cases.

Figure 8:
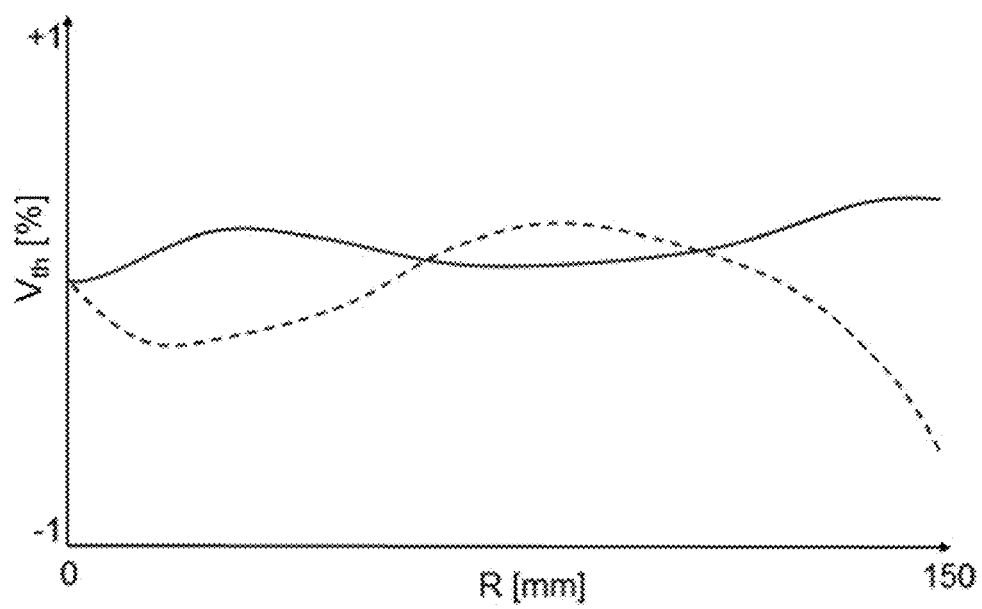
FIG. 8 shows, over the radius R, the profile of the deviation $V_{th}$ in the layer thickness from a target value in the case of a semiconductor wafer produced in accordance with the invention (solid line) with layer thickness according to the invention and in the case of a semiconductor wafer (dotted line) which has not been produced in an inventive manner.

FIG. 8 shows, over the radius R, the profile of the deviation $V_{th}$ in the layer thickness from a target value in the case of a semiconductor wafer produced in accordance with the invention (solid line) and in the case of a semiconductor wafer (dotted line) which has been produced by the different method. Only the semiconductor wafer produced in accordance with the invention fulfilled the criterion of the invention with regard to layer thickness.

Figure 9:
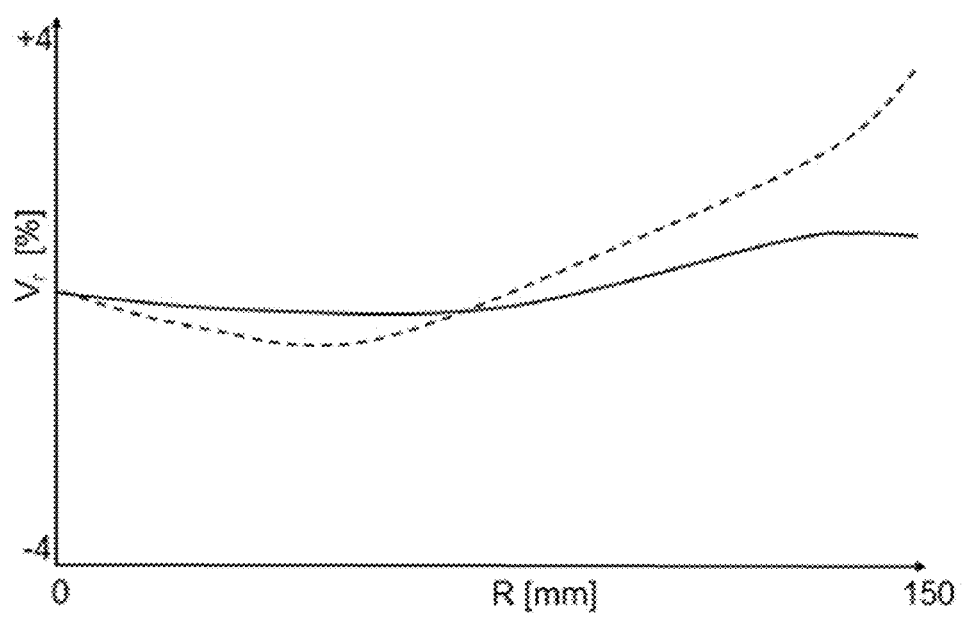
FIG. 9 shows, over the radius R, the profile of the deviation $V_r$ in the resistance from a target value in the case of a semiconductor wafer produced in accordance with the invention (solid line) with layer thickness according to the invention and in the case of a semiconductor wafer (dotted line) which has not been produced in an inventive manner.

FIG. 9 shows, over the radius R, the profile of the deviation $V_r$ in the resistance from a target value in the case of a semiconductor wafer produced in accordance with the invention (solid line) and in the case of a semiconductor wafer (dotted line) which has been produced by the different method. Only the semiconductor wafer produced in accordance with the invention fulfilled the criterion of the invention with regard to resistance.

The above description of illustrative embodiments should be regarded as an illustration. The disclosure that has thus been made enables the person skilled in the art firstly to understand the present invention and the associated advantages, and secondly encompasses, within the understanding of the person skilled in the art, obvious alterations and modifications to the structures and methods described as well. Therefore, all such alterations and modifications and equivalents shall be covered by the scope of protection of the claims.

The invention claimed is:

1. A method of producing a coated semiconductor wafer of monocrystalline silicon, comprising:

providing a substrate wafer of monocrystalline silicon having a diameter of not less than 300 mm;

placing the substrate wafer atop a susceptor of an apparatus for coating individual wafers, wherein the apparatus has an upper cover with an annular region which concentrates radiation transmitted through the annular region in an edge region of the substrate wafer;

heating the substrate wafer to a deposition temperature by means of a radiation source arranged above the upper cover of the apparatus;

depositing an epitaxial layer of silicon by passing process gas comprising hydrogen and a deposition gas over the heated substrate wafer, where the deposition gas comprises dopant and a silicon source, wherein the process gas further comprises inert gas, and the hydrogen and the inert gas are in a volume ratio of not less than 6 and not more than 20.

2. The method as claimed in claim 1, wherein the edge region of the substrate wafer has a distance of up to 15 mm from an edge of the substrate wafer.

3. The method as claimed in claim 1, wherein the cross section through the annular region of the upper cover has upward convex curvature or the outline of a Fresnel lens.

* * * * *